(12) United States Patent
Oh

(10) Patent No.: US 7,345,940 B2
(45) Date of Patent: Mar. 18, 2008

(54) METHOD AND CIRCUIT CONFIGURATION FOR REFRESHING DATA IN A SEMICONDUCTOR MEMORY

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 453 days.

(21) Appl. No.: 10/715,812

(22) Filed: Nov. 18, 2003

(65) Prior Publication Data

US 2005/0105357 A1    May 19, 2005

(51) Int. Cl.
  *G11C 7/00*  (2006.01)
(52) U.S. Cl. ............. 365/222; 365/230.06; 365/189.12
(58) Field of Classification Search ................ 365/222, 365/189.04, 229, 230.01
  See application file for complete search history.

(56) References Cited

U.S. PATENT DOCUMENTS

| 5,283,885 | A |   | 2/1994 | Hollerbauer |
| 5,321,662 | A | * | 6/1994 | Ogawa ........................ 365/222 |
| 5,469,559 | A |   | 11/1995 | Parks et al. |
| 5,798,976 | A | * | 8/1998 | Arimoto ...................... 365/222 |
| 6,215,714 | B1 |   | 4/2001 | Takemae et al. |
| 6,452,859 | B1 | * | 9/2002 | Shimano et al. ....... 365/230.06 |
| 6,721,223 | B2 | * | 4/2004 | Matsumoto et al. ......... 365/222 |
| 6,744,684 | B2 | * | 6/2004 | Arimoto et al. ............. 365/222 |
| 6,956,782 | B2 | * | 10/2005 | Hoehler ...................... 365/222 |
| 2002/0032842 | A1 | * | 3/2002 | Kawauchi et al. .......... 711/147 |
| 2003/0028711 | A1 | * | 2/2003 | Woo et al. .................. 711/106 |
| 2003/0067826 | A1 | * | 4/2003 | Janzen ....................... 365/222 |
| 2003/0095459 | A1 |   | 5/2003 | Derner et al. |
| 2004/0153603 | A1 | * | 8/2004 | Janzen ....................... 711/106 |
| 2005/0002253 | A1 | * | 1/2005 | Shi et al. .................... 365/222 |
| 2005/0078538 | A1 | * | 4/2005 | Hoehler ...................... 365/222 |
| 2005/0078539 | A1 | * | 4/2005 | Schoenfeld et al. ........ 365/222 |

FOREIGN PATENT DOCUMENTS

EP  0 917 152 A1  5/1999
WO  WO 2005/006341 A1  1/2005

OTHER PUBLICATIONS

PCT International Search Report and Written Opinion dated Apr. 27, 2005.

* cited by examiner

*Primary Examiner*—Thong Q. Le
(74) *Attorney, Agent, or Firm*—Patterson & Sheridan, L.L.P.

(57) ABSTRACT

Methods and circuit configurations for refreshing data in a semiconductor memory device in which refresh operations are performed for a limited number of rows. The limited number of rows may include only those rows that contain valid data, for example, as determined by monitored write operations.

12 Claims, 7 Drawing Sheets

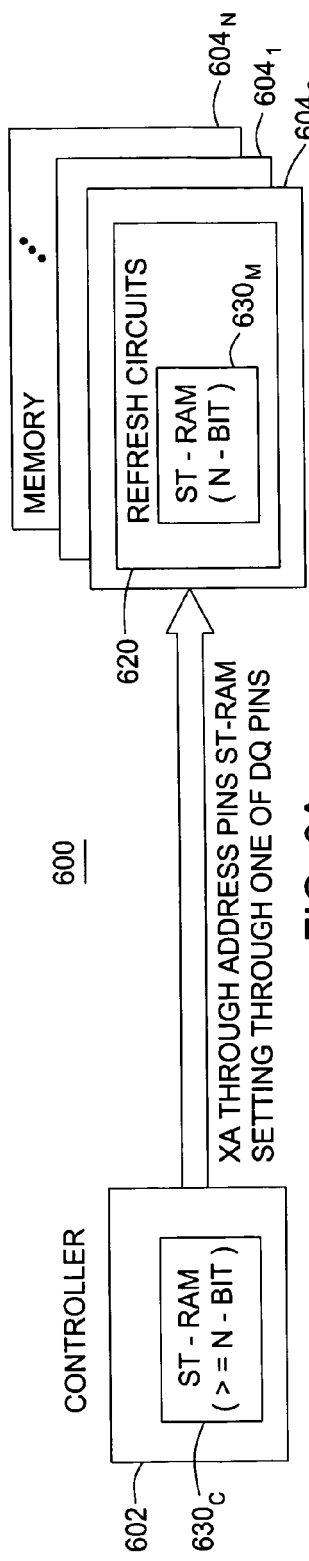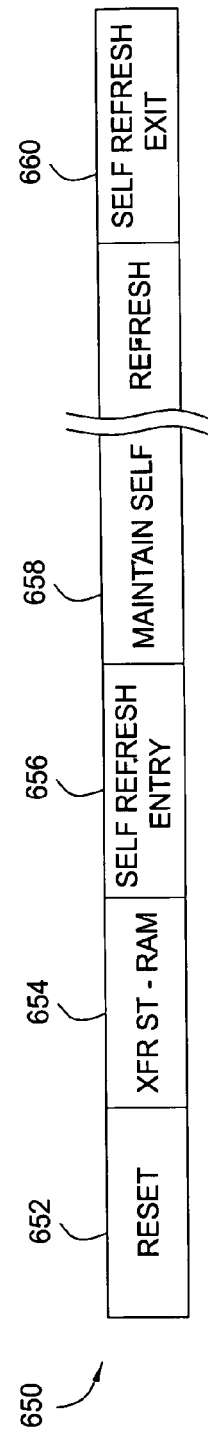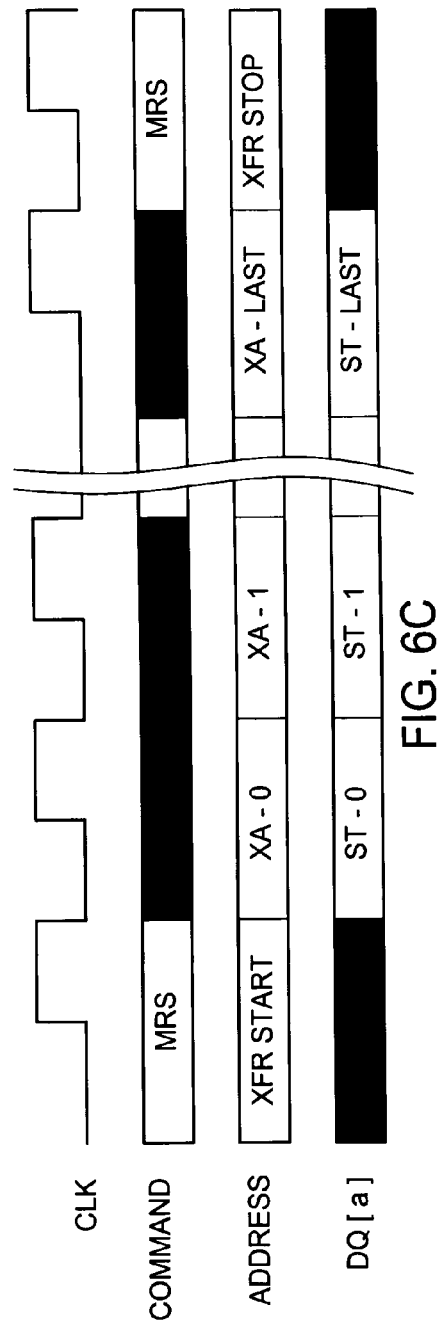

METHOD AND CIRCUIT CONFIGURATION FOR REFRESHING DATA IN A SEMICONDUCTOR MEMORY

BACKGROUND OF THE INVENTION

1. Field of the Invention

The present invention generally relates to semiconductor memory devices and, more particularly, to dynamic semiconductor memory devices having memory cells that require refresh.

2. Description of the Related Art

The evolution of sub-micron CMOS technology has resulted in an increasing demand for high-speed semiconductor memory devices, such as dynamic random access memory (DRAM) devices, pseudo static random access memory (PSRAM) devices, and the like. Herein, such memory devices are collectively referred to as DRAM devices. Such devices utilize memory cells consisting of one transistor and one capacitor. Due to leakage, the memory cells require periodic refreshing to protect data that is stored in the memory cell from corruption or decaying over time. The data stored in the memory cell is automatically restored to a full logic level when accessed (e.g., via a read or write operation), but must be periodically refreshed when not accessed. Therefore, DRAM devices typically include refresh circuitry to facilitate memory cell refresh.

FIG. 1 illustrates an exemplary DRAM device 100 utilizing a conventional refresh circuit 120 to refresh rows of memory cells arranged in four banks ($104_0$-$104_3$). As illustrated, the refresh circuit 120 generally includes a refresh timer 122 and a refresh address counter 126. The refresh timer 122 is enabled when a self-refresh mode is entered, in response to a command decoder 112 detecting a self-refresh command issued by an external device via a command bus 128. When enabled, the refresh timer generates periodic refresh request (REFRESH_REQUEST) signals that initiate refresh operations via bank control logic 106. The frequency of the refresh request signals is selected to ensure each row is accessed within a minimum specified retention time of the memory cells.

In response to a refresh request signal, the bank control logic refreshes a row of memory indicated by the row address (RA) generated by the refresh address counter 126. The upper bits of the row address may indicate which bank 104 contains the row to be refreshed. The refresh request signal may also enable a delay circuit 124, the output of which signals the refresh address counter to increment the row address. As illustrated, via an OR gate 128, external refresh commands (e.g., auto-refresh commands), may also initiate a refresh request and signal the refresh address counter to increment the row address.

Because each row of cells must be accessed within a specified cell retention time, refresh operations occur frequently. As a result, refreshing memory cells is a power-consuming routine. In battery-powered computer systems (e.g., palm-top computers, mobile and hand-held electronic devices, and the like), minimization of power consumption is critically important. One method that may reduce the power consumption of the memory is known in the art as a partial array refresh (PAR) scheme. Using the PAR scheme in DRAM devices having a plurality of memory banks, only the memory banks where the memory cells contain valid data are refreshed.

FIG. 2 depicts a logical diagram of an exemplary PAR scheme for use in a DRAM device having four banks ($104_0$-$104_3$). Bits in a mode register (e.g., a mode register 114, as shown in FIG. 1) may be programmed (e.g., via a mode register set command) to determine over what address range refresh operations will take place. As illustrated, all four banks, the first two banks, the first bank, or only half of the first bank may be selected. The self-refresh current will be proportional to the number of banks selected. For example, self-refresh current may be reduced by 50% if only the first two banks are selected.

However, one disadvantage with PAR schemes, is that the performance of multiple bank memories, such as DRAMs and double data rate (DDR) DRAMs, is often optimized by interleaving operations involving different banks, such that certain latencies associated with accessing each bank are hidden. As an example, by operating two or more banks in an interleaved manner, precharge time, or the time from a bank active to column access, may be hidden. If only one bank is chosen in a PAR scheme, however, multiple bank operation is no longer an available option. Another disadvantage with PAR schemes is that it is not likely all memory cells in a selected bank actually contain valid data. As a result, the power savings is not maximized, as a number rows that do not contain valid data continue to be refreshed.

Accordingly, there is a need in the art for an improved method and circuit configuration for refreshing data in semiconductor memory devices.

SUMMARY OF THE INVENTION

Embodiments of the present invention generally provide methods and circuit configurations for refreshing data in a semiconductor memory device in which refresh operations are performed for a limited number of rows.

One embodiment provides a method for reducing current in a semiconductor memory device comprising a plurality of rows of memory cells. The method generally includes maintaining a plurality of bits indicative of rows of memory cells that are to be refreshed and refreshing only those rows that are to be refreshed, as indicated by the plurality of bits.

Another embodiment provides a method for selectively refreshing rows of memory cells in one or more semiconductor memory devices. The method generally includes monitoring write operations to memory cells, maintaining a plurality of bits indicative of rows containing memory cells involved in the monitored write operations, and limiting the number of rows for which refresh operations are performed based on the plurality of bits.

Another embodiment provides a semiconductor memory device generally including a plurality of rows of memory cells, refresh circuitry, row state circuitry an refresh enable circuitry. The refresh circuitry is generally configured to issue refresh requests for the rows of memory cells when the memory device is placed in a self-refresh mode. The row state circuitry is generally configured to maintain a plurality of bits indicative of rows that are to be refreshed. The refresh enable circuitry is generally configured to limit the number of rows for which refresh requests are issued based on the bits of the row state circuitry.

Another embodiment provides a system generally including a memory device having a plurality of rows of memory cells and a memory controller. The memory device is generally configured to limit the number of rows that are refreshed, during a self-refresh mode, based on row data indicative of rows containing memory cells that have been written to. The memory controller is generally configured to monitor write operations to the memory device, generate the row data based on the monitored write operations, and transfer the row data to the memory device prior to placing the memory device in the self-refresh mode

BRIEF DESCRIPTION OF THE DRAWINGS

The teachings of the present invention can be readily understood by considering the following detailed description in conjunction with the accompanying drawings, in which:

FIG. 6A illustrates an exemplary system utilizing a memory controller with state RAM in accordance with one embodiment of the present invention; and FIGS. 6B-6C illustrate exemplary diagrams for transferring data from a memory controller state RAM to a memory device state RAM, in accordance with one embodiment of the present invention.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods and circuit configurations for refreshing data in a semiconductor memory device in which only rows with memory cells that contain valid data are refreshed. For some embodiments, bits in a memory circuit (referred to herein as a state RAM) may be maintained to indicate which rows contain valid data. In other words, each bit in the state RAM may correspond to a refreshable row, with the state of the bit indicating whether a memory cell in the corresponding row has been written to since a reset event. When performing refresh operations, only those rows that have been written to, as indicated by bits in the state RAM, are refreshed, thus avoiding unnecessary refresh operations for rows that do not contain valid data and reducing power.

The refresh circuits described herein may be used to advantage in any type of devices that utilize dynamic memory cells that require refresh (e.g., processors, digital signal processors, or other type devices with embedded DRAM). However, to facilitate understanding, the following description will refer to memory devices, such as dynamic random access memory (DRAM) or pseudo static RAM (PSRAM) devices, as specific, but not limiting examples of devices in which the refresh circuits may be utilized. While the following description will describe limiting the number of rows refreshed during self-refresh operations (e.g., while a device is in a stand-by or long idle state), those skilled in the art will recognize the techniques may also be applied to limit the number of rows refreshed during auto-refresh operations (e.g., controlled by a memory controller while a device is in an active state).

An Exemplary Refresh Circuit

Figure 1:
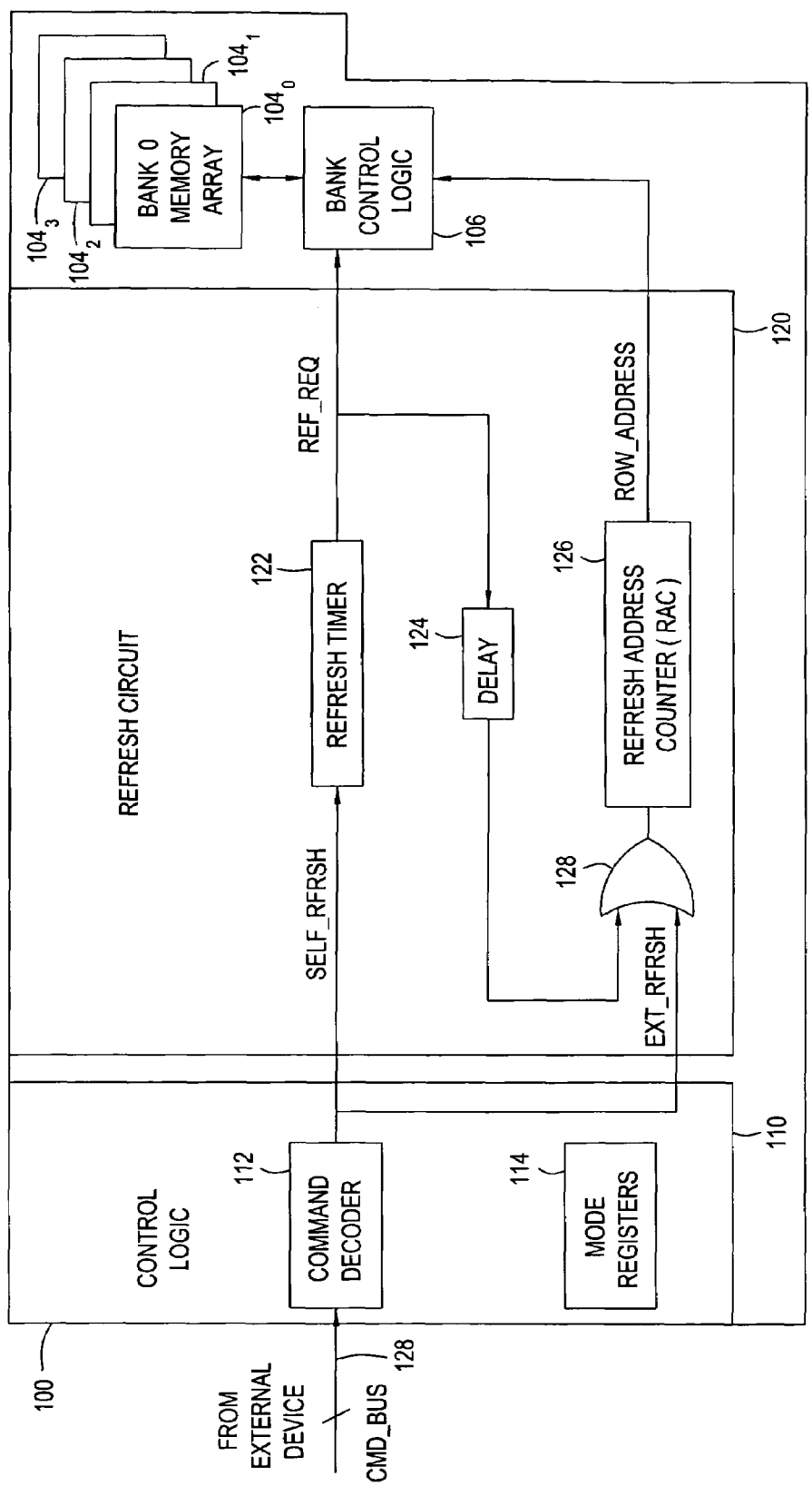
FIG. 1 illustrates an exemplary semiconductor memory device utilizing a refresh circuit in accordance with the prior art.
Figure 2:
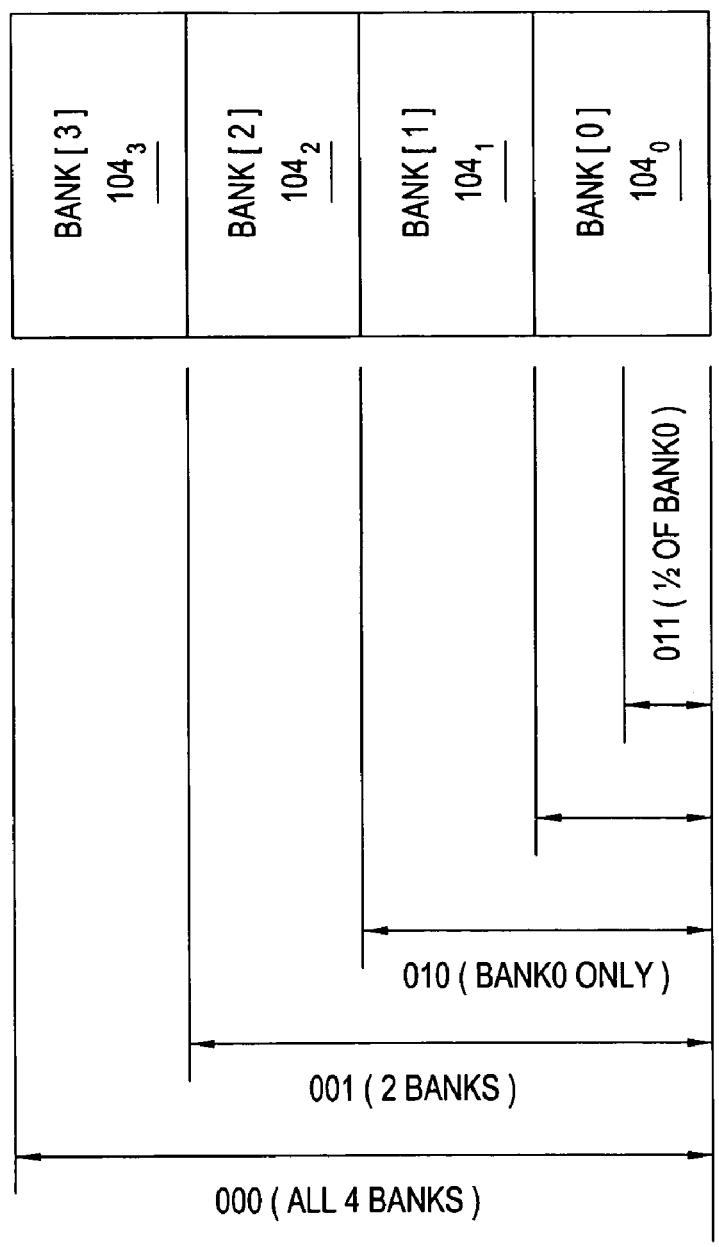
FIG. 2 is a logical block diagram of a partial array refresh (PAR) scheme in accordance with the prior art.
Figure 3:
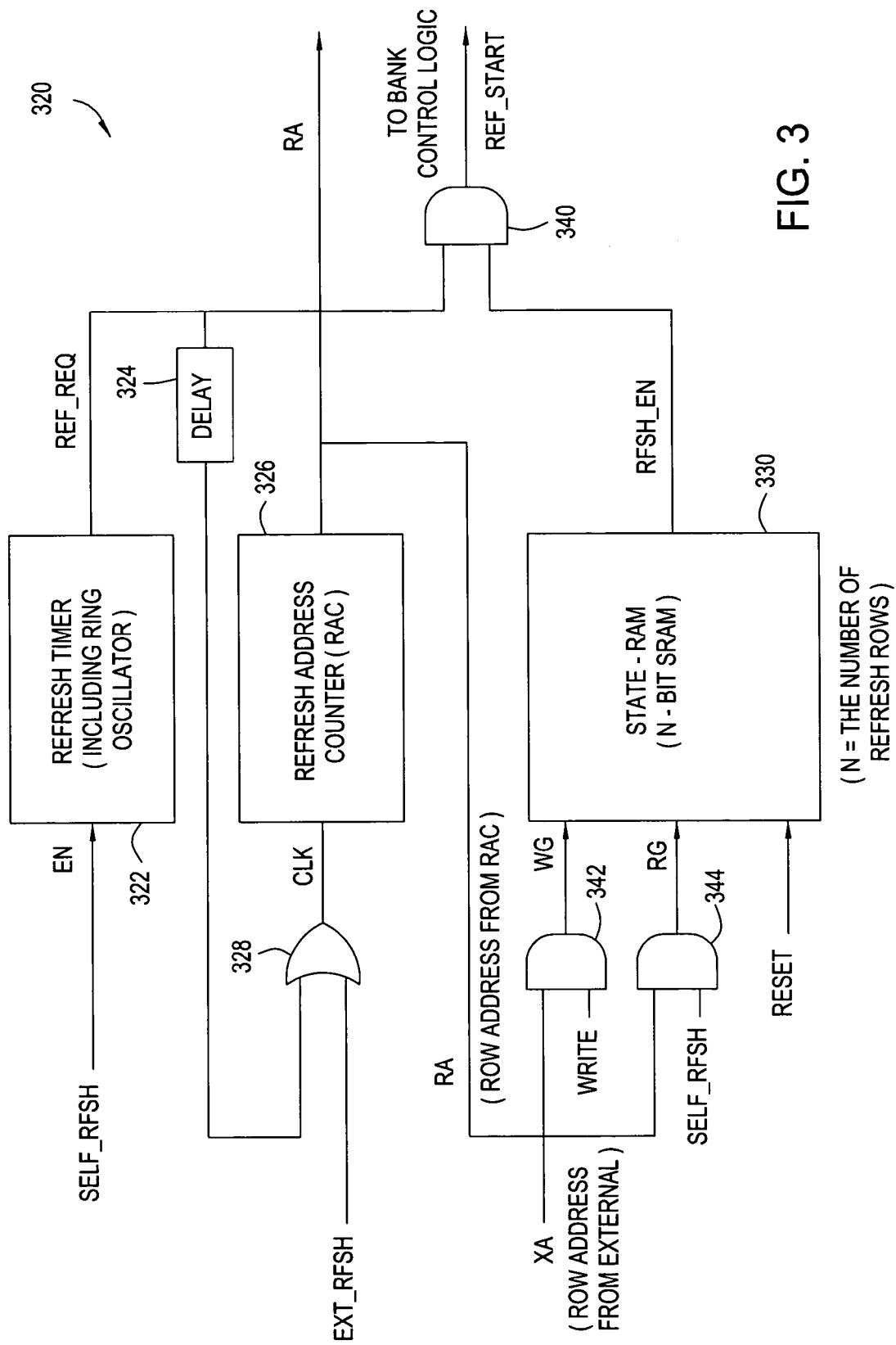
FIG. 3 illustrates an exemplary refresh circuit in accordance with one embodiment of the present invention.

FIG. 3 illustrates an exemplary refresh circuit 320 for use in a memory device, such as a PSRAM or a DRAM device 100 described above with reference to FIG. 1. As illustrated, the refresh circuit 320 may include a refresh timer 322 and a refresh address counter 326 that may operate in a similar manner to those utilized in conventional refresh circuits, such as the refresh circuit 120 of FIG. 1. However, a state RAM block 330 added to the refresh circuit 320 may limit refresh operations, for example, to only those rows that contain valid data.

As illustrated, the refresh timer 322 may be enabled in response to a self-refresh command (e.g., a self-refresh command issued by an external device). When enabled, the refresh timer generates periodic refresh request (REFRESH_REQUEST) signals. Refresh requests may also be initiated in response to externally supplied "auto" refresh commands. In either case, the row to be refreshed may be determined by the row address (RA) generated by the RAC 326. However, rather than automatically initiate a refresh operation for the indicated row based on the refresh request signal (e.g., by supplying the refresh request signal and row address to bank control logic), refresh operations may only be initiated if an enable signal (REFRESH_ENABLE) is asserted by the state RAM block 330, indicating the current row contains valid data.

As illustrated, refresh operations may be initiated by a refresh start signal (REFRESH_START) asserted (by an AND gate 340) only if REFRESH_ENABLE and REFRESH_REQUEST are both asserted. Therefore, during refresh operations, the state RAM block 330 is generally configured to assert REFRESH_ENABLE in response to determining that the row corresponding to the current row address (RA) contains memory cells with valid data. If the current row does contain valid data, REFRESH_ENABLE is asserted, and the REFRESH_REQUEST signal causes the REFRESH_START signal, which initiates a refresh operation for the row indicated by the current row address (RA). On the other hand, if the current row memory cells do not contain valid data (e.g., have not been written to since a reset event, as described below), REFRESH_ENABLE is de-asserted, inhibiting refresh operations for the current row. Of course, one skilled in the art will recognize that, for other embodiments, the REFRESH_ENABLE may serve to inhibit refresh operations in other ways, for example, by disabling the refresh timer 322 that would also prevent refresh operations.

Figure 4:
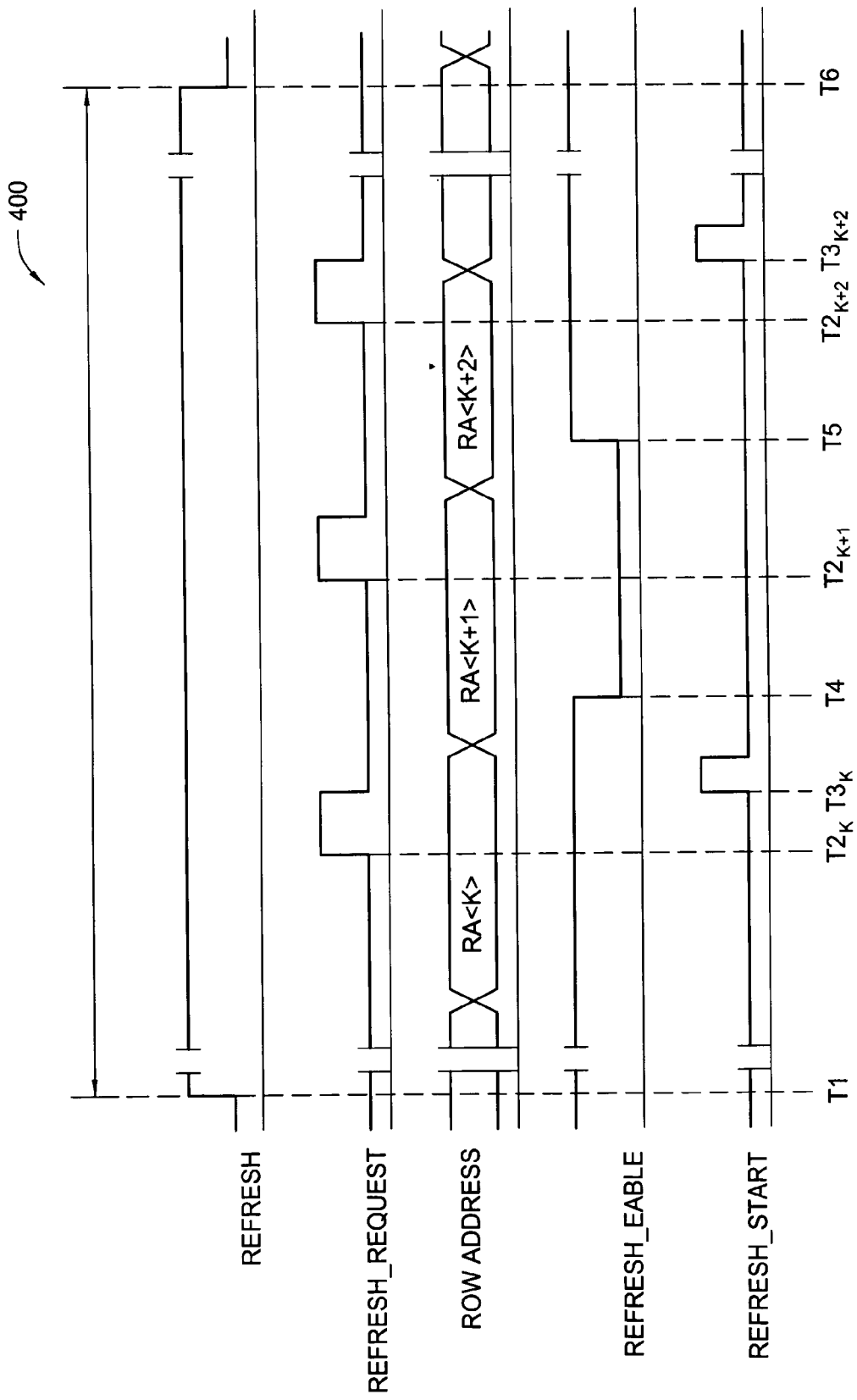
FIG. 4 is an exemplary timing diagram of signals utilized in the exemplary refresh circuit shown in FIG. 3.

Operation of the various components of the refresh circuit 320 may be further described with reference to FIG. 4, which illustrates an exemplary timing diagram for refresh operations. Of course, those skilled in the art will recognize that the illustrated logic levels (high for assertion) are arbitrary and the actual logic levels and timing for each signal may vary, for example, depending on an exact circuit implementation.

At time T1, a self-refresh mode is entered, enabling the refresh timer 332. At time $T2_K$, a refresh request signal (REFRESH_REQUEST) is generated by the refresh timer 332, while the row address generated by the RAC 326 points to a row K. As illustrated, the state RAM block 330 has asserted REFRESH_ENABLE, indicating at least one memory cell in row K contains valid data. As a result, at time T3 (e.g., differing from $T2_K$ only by propagation delays of gate 340) REFRESH_START is asserted, initiating a refresh operation for row K.

RAC 126 then increments the row address to K+1, a row whose memory cells do not contain valid data. In response, the state RAM block 330 de-asserts REFRESH_ENABLE, at time T4. As a result, when another refresh request signal (REFRESH_REQUEST) is generated by the refresh timer 332 at time $T2_K+1$, REF_START is not asserted and a refresh operation for row K is not initiated. Once the row address is incremented to a row that does contain valid data (row K+2 in the illustrated example) REFRESH_ENABLE is again asserted, enabling refresh operations for that row.

An Exemplary State RAM Circuit Configuration

The state RAM block 330 may include any suitable circuitry for storing and providing read-out of the status of refreshable rows. For some embodiments, the state RAM block 330 comprises an N-bit register, arranged as an array of N memory cells to hold bit information, each corresponding to a refreshable row of memory. The logic state of each bit may indicate whether any memory cells in a corresponding row contain valid data and should, therefore, be refreshed. For example, if at least one memory cell of the row contains valid data, the corresponding bit may have a logic high state. As such, the REFRESH_ENABLE signal may simply represent a read-out, from the state RAM block 330, of the bit corresponding to the current row address (RA).

The refresh circuit 320 may include any suitable circuitry allowing the state RAM block 330 to be read during refresh operations and written during normal write operations. For example, a read gating (RG) circuit 344, enabled during self refresh, may be configured to apply the current row address to the state RAM block 330, and generate any other suitable control signals to enable readout of the corresponding cell. Similarly, a write gating (WG) circuit 344, enabled during write operations, may be configured to apply an externally supplied write address (denoted XA) to the state RAM block 330, and generate any other suitable control signals to enable writing to a cell to indicate a corresponding row has been written to and, thus, contains valid data.

In other words, a write operation to any cells in a row will cause the corresponding bit in the state RAM block 330 to be set. For some embodiments, the bits may stay set until a reset event occurs, for example, causing assertion of a reset signal (RESET), that clears all the bits. As will be described in greater detail below, the reset signal may be asserted under hardware control (e.g., via an externally accessible pin) or under software control (via a mode register set command). In any case, assertion of RESET may initialize the state RAM block 330 and define from when bits of the state RAM block 330 are programmed, through write operations, to indicate corresponding rows contain valid data, which may be useful at times. For example, when a system with memory devices utilizing the refresh circuit 302 performs an initialization test, such as a power ON self-test (POST), all bits of the state RAM block 330 may be set due to the test. Therefore, to prevent all rows from being refreshed after the test, the state RAM block 330 may be reset.

Figure 5A:
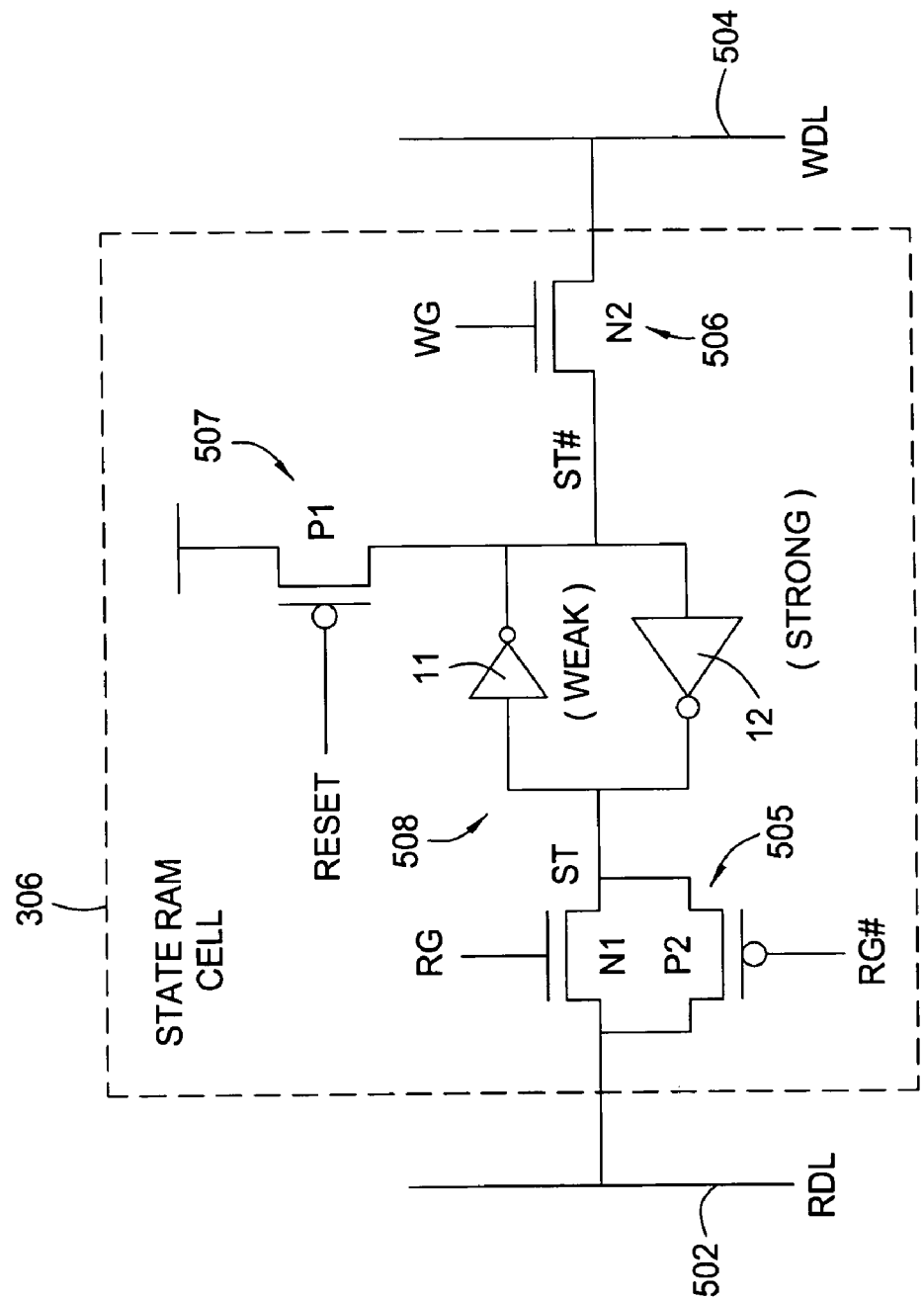
FIG. 5A illustrates an exemplary circuit configuration of a memory cell of the state RAM block of FIG. 3 in accordance with one embodiment of the present invention.

The memory cells of the state RAM block 330 may take any form suitable to store the bit information (and need not necessarily be RAM). FIG. 5A illustrates one type of an exemplary memory cell 306. As illustrated, the memory cell 306 may include a read-out pass gate 505, write switch 506, reset switch 507, and a data latch 508. As illustrated, the read-out switch 505 may be coupled with a read data line (RDL) 502 when a pair of complementary read gate signals (RG/RG#) are asserted, for example, by row decoder circuitry 604 and column decoder circuitry 606 illustrated in FIG. 5B.

Similarly, the write switch 506 may be coupled with a write data line (WDL) 504, when a write gate signal (WG) is asserted, thus allowing the state of the WDL 504 to be written to the data latch 508. As illustrated, the forward inverter 12 of the latch 508 may be stronger than the feedback inverter 11, facilitating writes to the latch 508 through the write switch 506 and speeding read operations through the pass gate 505. In the exemplary configuration, when a corresponding row is written to, the cell 306 is written to while WG is high, by pulling the node ST# low, thus latching a logic high to node ST through inverter 12. To reset the latch 508, the node ST# may be pulled up through the reset switch 507, when a reset signal is asserted (low). As previously described, a common reset signal may reset all memory cells 306 of the state RAM block 330.

Figure 5B:
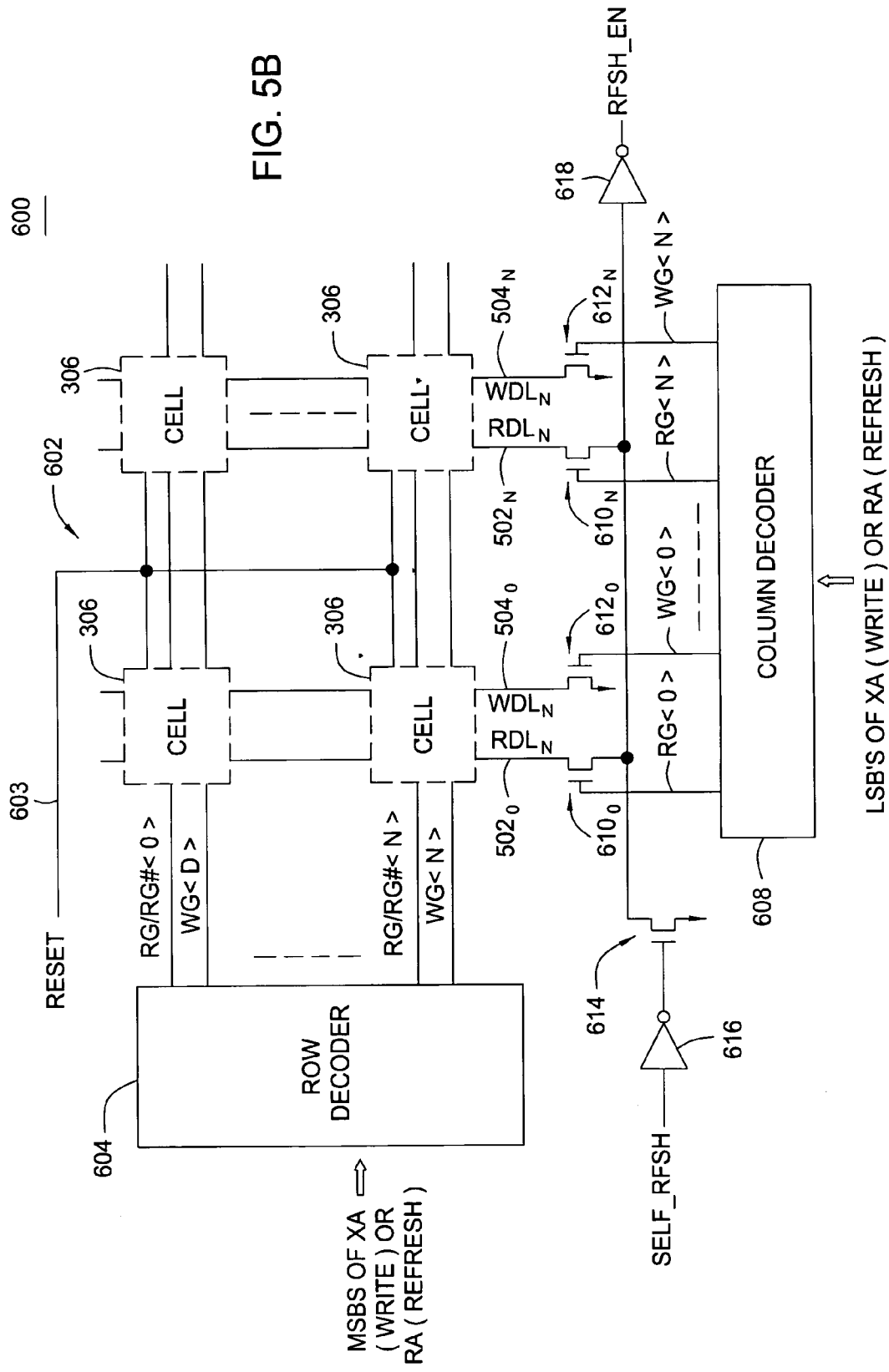
FIG. 5B illustrates an exemplary layout diagram of the state RAM block of FIG. 3 in accordance with one embodiment of the present invention.

FIG. 5B illustrates an exemplary layout 600 of memory cells 306 of the state RAM block 330. To save substrate surface area, as well as to simplify the layout, the memory cells 306 may be arranged as an array structure 602. For example, while the number of rows to be refreshed may vary widely for different embodiments, the surface area occupied by the array 602 will typically be well below 1% of the total substrate surface area. Thus, the savings in power consumption may well outweigh the cost of the required real estate.

During write operations, a pair of WG signals may be generated (with only one asserted, corresponding to the current row) by the row decoder 604 and column decoder 608. For example, the WG signal generated by the row decoder 604 may enable the write switches 506 (shown in FIG. 5A), while the WG signal generated by the column decoder 608 may pull the corresponding WDL line low, via the a pull down transistor 612. As illustrated, during write operations, the row decoder 604 may receive, as inputs, the most significant bits (MSBs) of the external address XA (indicating the row involved), while the column decoder 608 may receive, as inputs, the least significant bits of XA. Thus, while an entire WDL line will be pulled down, the write switch 506 of only one memory cell coupled to the WDL line will be enabled.

In a similar manner, during read operations, the row decoder 604 may receive, as inputs, the most significant bits (MSBs) of the current row address RA, while the column decoder 608 may receive, as inputs, the least significant bits of RA. Thus, while an entire RDL 502 (coupled with an entire column of cells 306) will be coupled with an input of an inverter 618 (via a transistor 610) driving the REFRESH_ENABLE output, the read pass gate 504 of only one memory cell 306 coupled to the RDL line will be switched on. Thus, the output of the inverter 618 is indicative of the state of the memory cell for the selected row.

Memory Controller State RAM

For some embodiments, rather than monitor write operations on the memory device to track what rows contain valid data, write operations may be monitored externally, for example in a memory controller. For example, FIG. 6A illustrates an exemplary system 600 in which a memory controller 602 monitors write operations involving rows of memory cells residing on one or more memory devices 604. The memory controller 602 may maintain a state RAM block 630$_C$, which may be configured to store bits of information indicating which corresponding rows of memory devices 604 contain valid data.

For example, the memory controller state RAM block 630$_C$ may contain a sufficient number of bits to allow the memory controller 602 to monitor the status of the rows of all of the memory devices 604. Prior to placing the memory devices 604 in a self-refresh mode, the memory controller may transfer the row state information from the memory controller state RAM block 630$_C$ to state RAM blocks 630$_M$ of the individual memory devices 604. After the transfer is complete, the memory controller 602 may then place the memory devices 604 in the self-refresh mode.

FIG. 6B illustrates an exemplary sequence of operations 650 the memory controller 602 may perform to prepare and place the memory devices 604 in a self-refresh mode. The sequence of operations 650 may be performed to simultaneously transfer bits form the memory controller state RAM block 630$_C$ to the state RAM blocks 630$_M$ of a plurality of memory devices 604, or the sequence of operations 650 may be repeated for each memory device 604.

The memory controller 602 may first issue a reset command (652) for the memory state RAM blocks 630$_M$, followed by a command to transfer data (654) from the controller state RAM block 630$_C$ to the memory state RAM block 630$_M$. Once the transfer is complete, a self-refresh command (656) may be issued, placing the memory device 604 in the self-refresh mode (658). During the self refresh mode, refresh operations will only be performed for rows containing valid data, as indicated by the transferred state RAM contents, until the self-refresh mode is exited (660).

FIG. 6C illustrates an exemplary sequence 660 for transferring the contents of the controller state RAM block 630$_C$ to the memory state RAM block 630$_M$. As illustrated, an MRS command at a first clock cycle may signal a start of transfer, for example, by setting a mode register bit. During subsequent clock cycles, the controller may drive state RAM row addresses on the address bus, and the corresponding contents on (one line of) the data (DQ) bus. Once the transfer is complete, another MRS command may signal completion, for example, by clearing a mode register bit. According to this embodiment, the state RAM circuitry 330 described above may be modified to ensure a coupled write gate (WG) is enabled only when the transferred content is high (indicating refresh for a corresponding row should be enabled), unlike the normal write access enabling described above. In other words, during normal write access enabling, the bit was set regardless of the state (high or low) of data written to a corresponding row memory cell. However, when content is transferred, a bit is set only the corresponding bit in the controller state RAM block 630$_C$ is set.

Referring back to FIG. 6A, the memory controller state RAM block 630$_C$ may transfer a larger number of bits (>N) than the state RAM blocks 630$_M$ of the memory devices 604 hold. This may be the case, for example, if the memory performs refresh operations for more than one row at a time, for example, by compressing a portion (lower bits) of a row address in the refresh address counter block. Even in this case, however, utilizing the previously described state RAM circuitry (shown in FIGS. 5A-5B), the transfer operations should work, as more than one set operation to the same state RAM cell 306 has the same result (indicating a corresponding row or rows have valid data). Thus, for multiple rows refreshed together, a state RAM cell 306 corresponding to the multiple rows should be set if any of the multiple rows contain valid data requiring refresh.

Hybrid Partial Array Refresh Scheme

For some embodiments, the techniques described herein may be utilized in conjunction with conventional partial array refresh (PAR) schemes. For example, as previously described, conventional PAR schemes may be less than optimal, as a selected (partial) range of memory blocks to refresh may include a number of rows that do not contain valid data. However, utilizing the techniques described herein, only those rows within the selected range of memory blocks that contain valid data (e.g., as indicated by a state RAM block) may be refreshed, thus further reducing power. For non-selected banks of memory, however, all refresh operations may be inhibited, regardless of the state RAM content.

While the foregoing is directed to embodiments of the present invention, other and further embodiments of the invention may be devised without departing from the basic scope thereof, and the scope thereof is determined by the claims that follow.

What is claimed is:

1. A method for selectively refreshing rows of memory cells in one or more semiconductor memory devices, comprising:
   monitoring, by a memory controller coupled with the semiconductor memory devices, write operations to the memory cells;
   maintaining a plurality of bits indicative of rows containing memory cells involved in the monitored write operations on the memory controller;
   transferring a first plurality of the bits to a first memory device;
   placing the first memory device in a self-refresh mode, in which refresh operations are performed for only those rows containing memory cells involved in the monitored write operations, as indicated by the first plurality of bits;
   transferring a second plurality of the bits to a second memory device; and
   placing the second memory device in a self-refresh mode, in which refresh operations are performed for only those rows containing memory cells involved in the monitored write operations, as indicated by the second plurality of bits.

2. The method of claim 1, further comprising:
   issuing a self-refresh command from the memory controller to the memory device.

3. A semiconductor memory device, comprising:
   a plurality of rows of memory cells;
   refresh circuitry configured to issue refresh requests for the rows of memory cells when the memory device is placed in a self-refresh mode;
   row state circuitry configured to maintain a plurality of bits indicative of rows that are to be refreshed;
   pins configured to receive the plurality of bits from a memory controller and to transfer the plurality of bits to the row state circuitry; and
   refresh enable circuitry configured to limit the number of rows for which refresh requests are issued based on the bits of the row state circuitry, wherein the refresh enable circuitry is configured to limit the number of rows for which refresh requests are issued by generating a signal used to inhibit refresh requests.

4. The semiconductor memory device of claim 3, wherein the signal is generated by accessing a bit corresponding to a row address generated by a refresh address counter.

5. The semiconductor memory device of claim 4, wherein each bit corresponds to a single row of memory cells.

6. The memory device of claim 3, wherein the memory controller is configured to issue a self-refresh command to the memory device.

7. A system, comprising:
a first memory device having a plurality of rows of memory cells, wherein the first memory device is configured to limit the number of rows that are refreshed, during a self-refresh mode, based on row data indicative of rows that are to be refreshed;
a second memory device having a plurality of rows of memory cells, wherein the second memory device is configured to limit the number of rows that are refreshed, during a self-refresh mode, based on row data indicative of rows that are to be refreshed; and
a memory controller configured to:
monitor write operations to the first memory device, generate the row data of the first memory device based on the monitored write operations, and transfer the row data of the first memory device to the first memory device prior to placing the memory device in the self-refresh mode, and;
monitor write operations to the second memory device, generate the row data of the second memory device based on the monitored write operations, and transfer the row data of the second memory device to the second memory device prior to placing the memory device in the self-refresh mode.

8. The system of claim 7, wherein:
the row data is stored in the memory device in an array of memory cells; and
the memory controller is further configured to reset the array of memory cells prior to transferring the row data to the memory device.

9. The system of claim 8, wherein the memory controller is configured to reset the array of memory cells by writing to a mode register of the memory device.

10. The system of claim 7, wherein the memory controller is configured to set a bit in the row data to indicate one or more cells in a corresponding row have been written.

11. The memory device of claim 3, wherein the plurality of bits is indicative of rows that have been written to and are to be refreshed.

12. The system of claim 7, wherein the memory controller is configured to issue a self-refresh command to the memory device.

* * * * *